United States Patent [19]

DiMaria et al.

[11] 4,143,393
[45] Mar. 6, 1979

[54] HIGH FIELD CAPACITOR STRUCTURE EMPLOYING A CARRIER TRAPPING REGION

[75] Inventors: Donelli J. DiMaria, Mt. Kisco; Donald R. Young, Ossining, both of N.Y.

[73] Assignee: International Business Machines Corporation, Armonk, N.Y.

[21] Appl. No.: 808,500

[22] Filed: Jun. 21, 1977

[51] Int. Cl.² .................................. H01L 29/34
[52] U.S. Cl. ............................ 357/52; 357/23; 357/59; 357/91
[58] Field of Search ............... 357/23, 54, 52, 59, 357/91

[56] References Cited

U.S. PATENT DOCUMENTS

| 3,972,059 | 7/1976 | DiStefano | 357/6 |
| 4,004,159 | 1/1977 | Rai | 307/238 |
| 4,027,320 | 5/1977 | Jacobs | 357/23 |
| 4,047,974 | 9/1977 | Harari | 148/1.5 |

Primary Examiner—Matin H. Edlow
Attorney, Agent, or Firm—Sughrue, Rothwell, Mion, Zinn and Macpeak

[57] ABSTRACT

A high field capacitor structure includes an insulating layer having a carrier trapping region between two electrodes. The trapping region improves electric breakdown characteristics of the capacitor structure and is particularly useful in avoiding the low breakdown voltages and high leakage currents normally encountered in structures with asperities, such as $SiO_2$ over poly Si. The trapping region can be formed by chemical vapor deposition (CVD) process, by evaporation or by ion implantation. The trapping region is close to the Si, but far enough away to eliminate the possibility of reverse tunneling from discharging the traps in the absence of an applied voltage.

14 Claims, 8 Drawing Figures

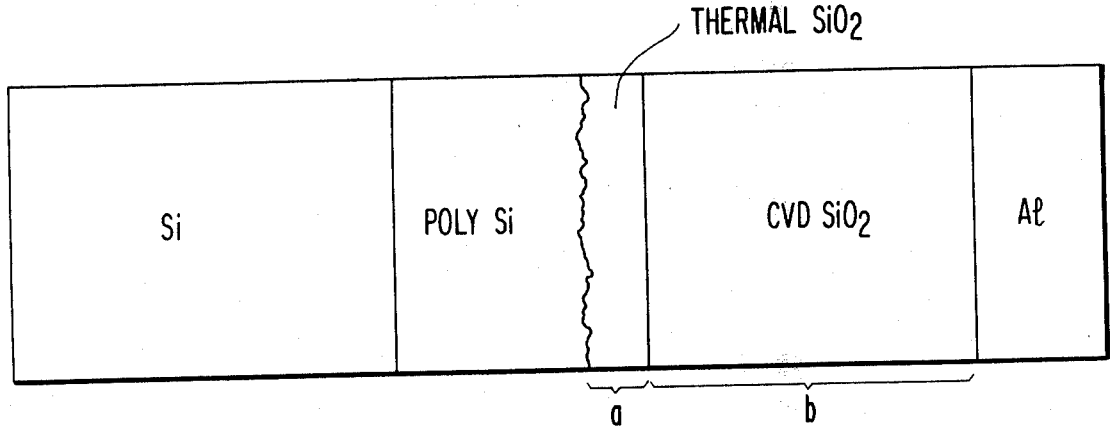

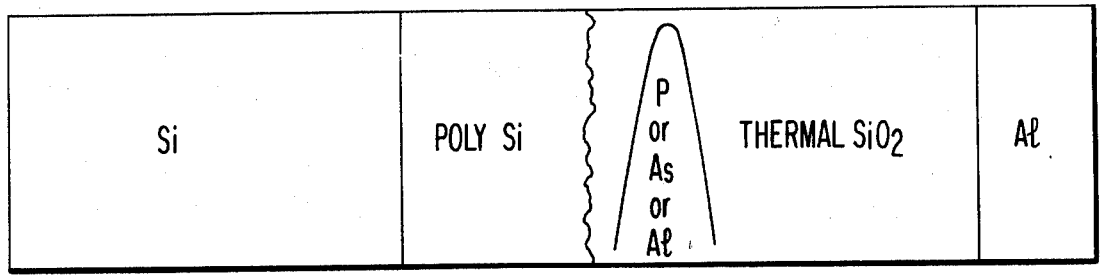

HIGH FIELD CAPACITOR STRUCTURE EMPLOYING A CARRIER TRAPPING REGION

BACKGROUND OF THE INVENTION

The present invention is generally related to capacitor structures, and more particularly to an improved high field capacitor structure employing a carrier trapping region and having particular application to semiconductor capacitor structures.

Asperities or defects in the silicon surface are generally thought to increase insulator leakage current and lead to low voltage breakdowns in metal-oxide-semiconductor (MOS) devices. This has been dramatically shown for thermal oxides grown on top of polycrystalline silicon by D. J. DiMaria and D. R. Kerr in "Interface Effects and High Conductivity and Oxides Grown From Polycrystalline Silicon", *Applied Physics Letters*, Volume 27, No. 9, Nov. 1, 1975, pp. 505–507. Thermal oxides grown on top of polycrystalline silicon are important for various types of devices based on Si technology, such as the Floating Avalanche Injection MOS (FAMOS), Rewritable Avalanche Injection Device (RADI), and Charge Coupled Device (CCD). It is believed that these asperities cause locally high fields to occur which in turn lead to localized high dark current densities (via interface limited, Fowler-Nordhiem tunneling) and low voltage breakdown.

Asperities on the surface of metallic substrates of thin film capacitors are believed to cause low field breakdowns in substantially the same manner as that observed in the case of thermal oxides grown on top of polycrystalline silicon. What is required is a way to reduce the high field points or their effect due to asperities between the substrate and the insulator in a capacitor structure in order to improve the leakage current and breakdown voltage of that structure.

SUMMARY OF THE INVENTION

According to the invention, a carrier trapping region or layer is incorporated into the insulator adjacent to the substrate. In the application of the invention to an MOS structure, the trapping region or layer is in the form of electron traps introduced into the $SiO_2$ insulator. The large local current densities due to the asperities readily charges up the electron traps at the high field points, thereby reducing the local fields and current in turn. The trapping region or layer should be as close to the silicon as possible to maximize the effect of the trapped charges on the local fields but far enough away to eliminate the possibility of reverse tunneling from discharging the traps in the absence of an applied voltage.

In the case of an MOS structure in which poly Si is first deposited on single crystal Si and then partially thermally oxidized, three ways of forming the trapping region or layer are specifically described. First, a thin thermal $SiO_2$ layer is formed on the poly Si. This thin thermal $SiO_2$ layer may be formed by thermally oxidizing the poly Si. Over the thin thermal $SiO_2$ layer, a relatively thick CVD $SiO_2$ layer is deposited. In this structure, the CVD $SiO_2$ layer acts as an electron trapping region. Second, the electron trapping efficiency of this structure may be substantially improved by depositing a very thin trapping layer over the thermal $SiO_2$ layer before depositing the relatively thick layer of CVD $SiO_2$. A preferred metal for this layer is tungsten, but other atoms, such as aluminum, can also be used. This layer is not continuous, but may be thought as many very thin dots as shown by D. R. Young, D. J. DiMaria, and N. A. Bojarcuk in "Electron Trapping Characteristics of W in $SiO_2$", *Journal of Applied Physics*, Aug. 1977. This structure permits the location of the electron traps to be very precisely defined. Finally, an alternate to the structure which includes the thin layer is a structure where the insulator between the poly Si and the metal electrode is entirely of thermal $SiO_2$. The electron trapping region or layer is formed in this insulator by ion implantation of phosphorus, arsenic or aluminum near the interface between the poly Si and the thermal $SiO_2$.

In the case of thin film capacitors, a typical substrate may be tantalum or aluminum. Over this substrate, an oxide of the substrate is chemically grown. In the case of a tantalum substrate, the insulator would be $Ta_2O_5$; whereas in the case of an aluminum substrate, the insulator would be $Al_2O_3$. As applied to this structure, according to the invention, an electron trapping region or layer is formed closely adjacent to the interface of the substrate and the chemically-grown oxide by ion implantation.

BRIEF DESCRIPTION OF THE DRAWINGS

Other advantages, aspects and uses of the present invention will become clear from the detailed description of the invention, taken in conjunction with the accompanying drawings, in which.

DESCRIPTION OF THE PREFERRED EMBODIMENTS

Figure 1:
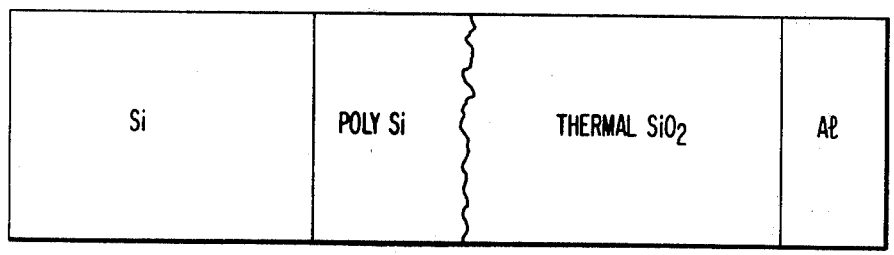
FIG. 1 is a cross-sectional representation of a typical MOS structure.

The deposition of polycrystalline silicon on degenerate n single crystal silicon, doping of the polycrystalline, and subsequent thermal oxidation is described, for example, in the above-referenced article by D. J. DiMaria and D. R. Kerr. FIG. 1 illustrates this structure in cross-section. The poly Si is deposited on a single crystal Si substrate and then thermally oxidized to produce a $SiO_2$ insulator. Over this $SiO_2$ insulator is deposited a metallic electrode, typically aluminum. As is illustrated in FIG. 1, the interface between the poly Si and the thermal $SiO_2$ is quite rough and uneven. The high points —that is, the points closest to the metal electrode— due to these asperities, are points of high fields. Although the average current across the interface may be relatively small, the localized high currents, due to the high fields at the localized high points, can cause a local breakdown of the $SiO_2$ insulator at relatively low average fields.

Figure 2:
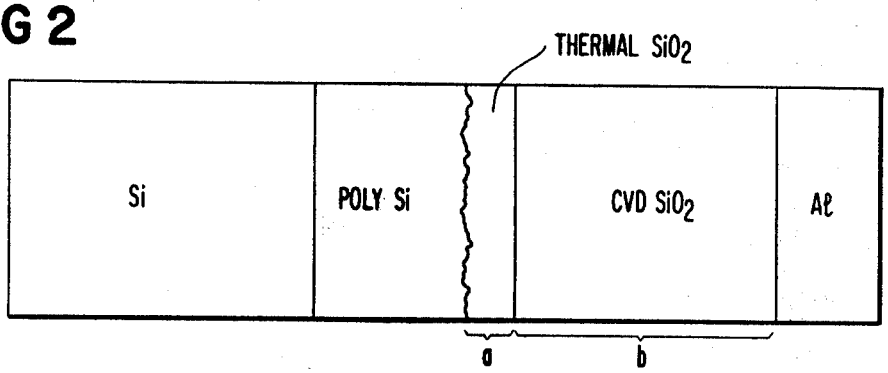
FIG. 2 is a cross-sectional representation of a MOS structure according to one embodiment of the invention.

In the MOS structure shown in FIG. 2, the thermal $SiO_2$ layer is relatively thin, having a thickness a. This layer may be formed by thermally oxidizing the poly Si. Over this relatively thin layer of thermal $SiO_2$, a considerably thicker layer of pyrolytic or CVD $SiO_2$ is formed. The thickness of the CVD $SiO_2$ layer is denoted by b. While the thermal $SiO_2$ layer does not have many electron traps, the CVD $SiO_2$ layer exhibits a certain electron trapping efficiency. This electron trapping efficiency is thought to be related to the water content of the CVD $SiO_2$.

Figure 3:
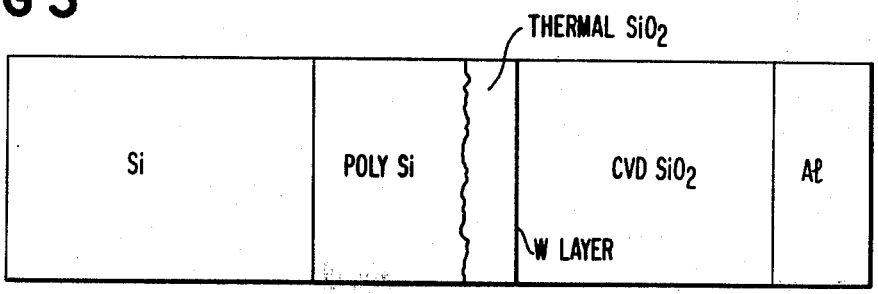
FIG. 3 is a cross-sectional view of a MOS structure according to a second embodiment of the invention.

A substantial improvement in the structure shown in FIG. 2 is achieved by the modification illustrated in FIG. 3. Here, a layer of tungsten is first deposited on the relatively thin thermal $SiO_2$ layer before the thicker CVD $SiO_2$ layer is deposited. This tungsten layer is extremely thin, on the order of about $10^{14}$ atoms/cm$^2$; and as a result, the layer is not continuous. This layer may be considered as consisting of many dots of tungsten. While tungsten has been used in a specific construction of the invention, those skilled in the art will recognize that other atoms could also be used, such as, for example, aluminum.

In order to demonstrate the advantages of the invention, MOS structures, according to FIGS. 1, 2 and 3, were fabricated and designated as Samples A, B and C, respectively, as follows:

Sample A

Al-thermal $SiO_2$ (450 Å)-poly Si ($3.5 \times 10^{-3}$ Ωcm n).

Sample B

Al-CVD $SiO_2$ (520 Å)-thermal $SiO_2$ (70 Å)-poly Si ($3.5 \times 10^{-3}$ Ωcm n).

Sample C

Al-CVD $SiO_2$ (520 Å)-W ($\approx 10^{14}$ atoms/cm$^2$)-thermal $SiO_2$ (70 Å)-poly Si ($3.5 \times 10^{-3}$ Ωcm n).

In each of the Samples A, B and C, the circular aluminum gate electrodes had areas of $1.3 \times 10^{-2}$ cm$^2$ and were approximately 3,000 Å in thickness. No post-metalization annealing was performed. All oxide thicknesses were determined by MOS capacitance. The dark current-applied gate voltage characteristics were measured on virgin samples using a constant voltage ramp or by stepping the voltage. For the constant voltage ramp experiments, ramp rates of $5.1 \times 10^{-2}$ MV/cm-sec or $9.5 \times 10^{-3}$ MV/cm-sec were used. Voltage was ramped in the direction of increasing the magnitude of either positive or negative bias until a current level of $8 \times 10^{-7}$ A/cm$^2$ was reached and then the ramp direction was reversed. The data has been plotted in the graphs of FIGS. 5 and 6 which have been corrected for the displacement current ($\approx 3.5 \times 10^{-9}$ A/cm$^2$) due to the time rate of change of the gate voltage. The initial starting voltage for the ramp experiments was when electronic conduction currents began to dominate over the displacement current. In the voltage step experiments, the magnitude of the average field was increased from 0 V in 1 MV/cm steps for both gate polarities until the samples suffered destructive breakdown. Although there were some detailed differences in the current-voltage characteristics due to differences in trapped negative charge buildup in the structures, the two experimental techniques yielded the same general results.

Figure 6:
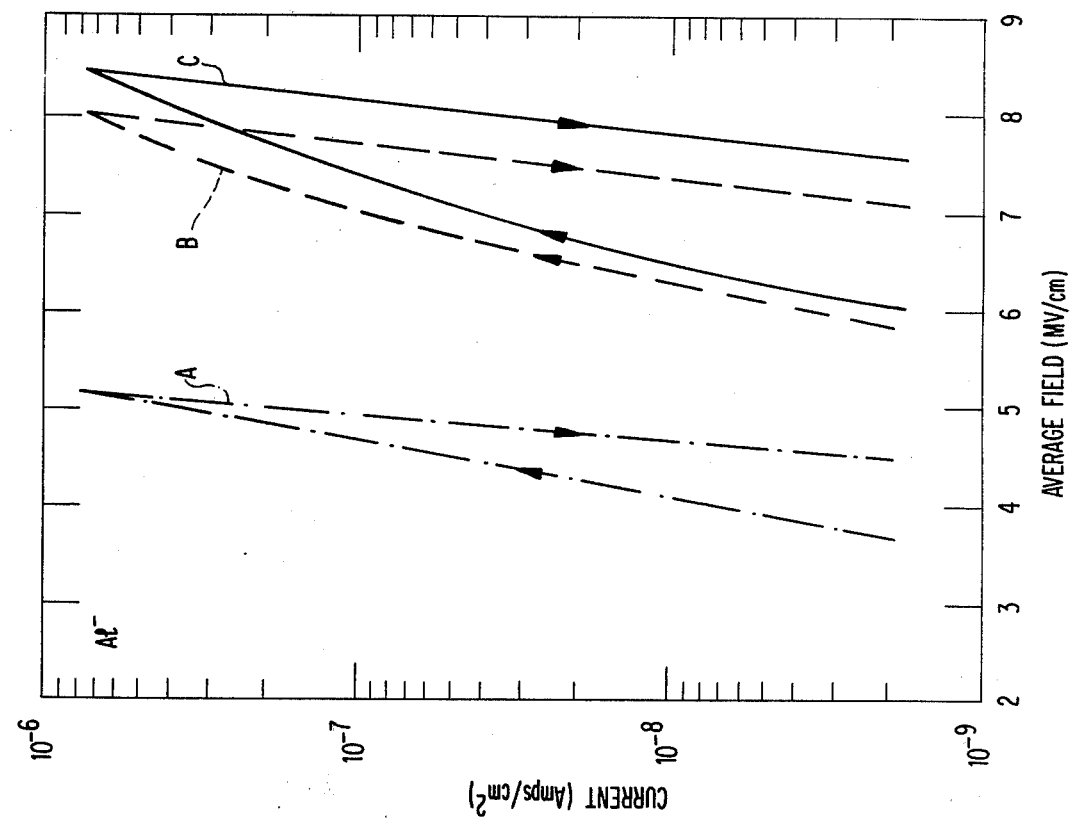
FIG. 6 is a graph representing the dark current density measured as a function of the magnitude of the average field for negative gate bias for the Samples A, B and C.
Figure 5:
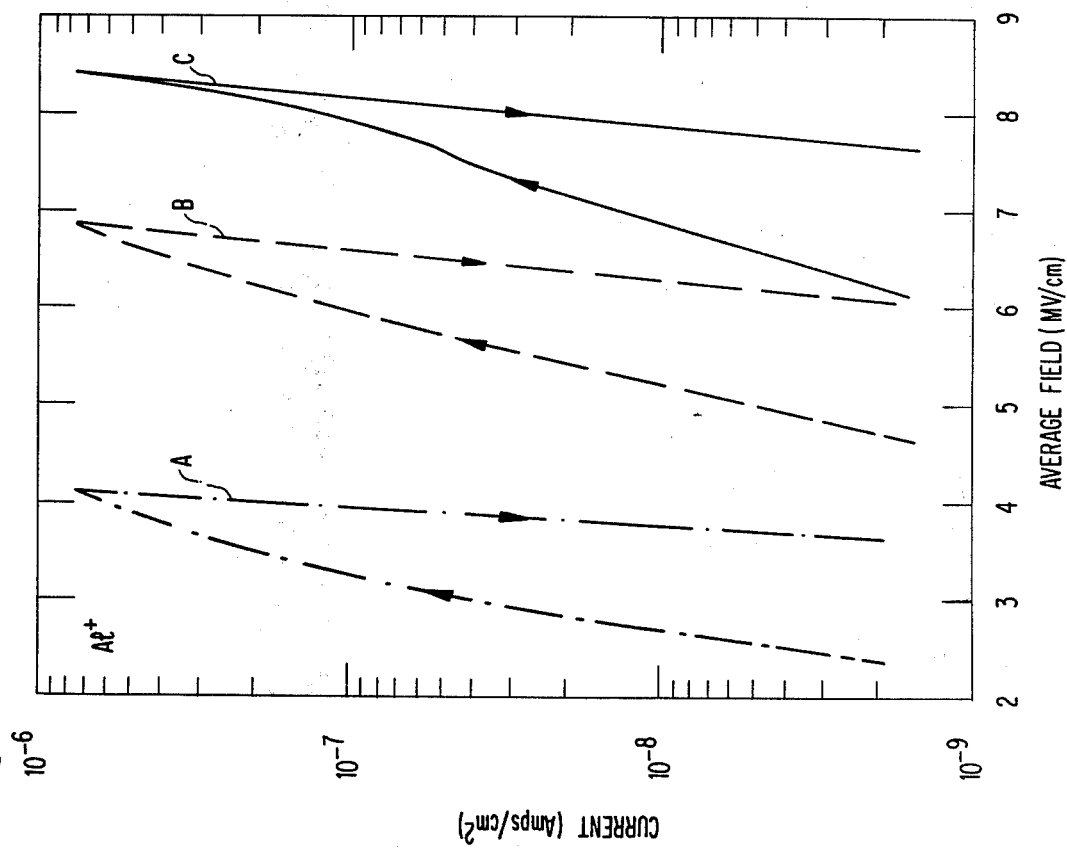
FIG. 5 is a graph showing the dark current density measured as a function of the magnitude of the average field for a positive gate bias of Samples A, B and C corresponding to FIGS. 1, 2 and 3, respectively.

FIGS. 5-8 clearly show that a charge trapping layer removes the effect of locally high fields due to asperities at the polycrystalline silicon-thermal silicon dioxide interface. In FIGS. 5 and 6, the magnitude of the average field (gate voltage magnitude divided by the total oxide thickness of the structure) required for a given current measurement in the external circuit is larger when an electron trapping layer is present for either voltage polarity. Note that the structure of Sample C (with the W layer) is better than the structure of Sample B (without the W layer). This is consistent with the experimental observation that the trapping efficiency of the structure with the W layer (Sample C) is greater than the structure with just the CVD oxide (Sample B). The I-V characteristics for both the structures of Sample B and C, which had a 520 Å CVD $SiO_2$ layer, are shifted to much higher average fields than the structure of Sample A. The increased trapping efficiency of the structure with the CVD oxide layer on the thermal oxide layer (Sample B) over the structure with just the thermal oxide (Sample A) grown on the polycrystalline silicon substrate is thought to be related to the water content of the pyrolytic or CVD oxide. The I-V characteristics of the structures of Samples B and C are in the range of those for MOS structures which have thermal oxides grown from single crystal silicon substrates.

The sequence of events occurring in the structures of Samples B and C to reduce the effect of asperities is believed to be as follows:

(1) At low-applied gate voltages, localized trapping occurs to rapidly remove the effect of the asperities.

(2) As the field is increased, uniform trapping occurs which shifts the I-V characteristics to higher average fields.

From the step voltage I-V measurements, localized trapping appeared to occur for the structures of Samples B and C at very low current levels ($\leq 7.9 \times 10^{-12}$ A/cm$^2$) and low-applied fields ($\leq 2$ MV/cm) for either polarity. Near this current level, there was a pronounced departure of the I-V characteristics for the structures of Samples B or C from that of the structure of Sample A. This departure appeared as a ledge (1.5-2 MV/cm wide) where the current increased very slowly up to a level between $7.9 \times 10^{-12}$ A/cm$^2$ and $3.9 \times 10^{-11}$ A/cm$^2$. This ledge was wider for the structure of Sample C (with the W layer) than the structure of Sample B (without the W layer). After these ledges, uniform trapping appears to be the dominant factor in controlling the I-V characteristic. The data from FIGS. 5 and 6 are representative of this uniform trapping behavior.

The hysterisis in the data represented by FIGS. 5 and 6 is due to electron trapping. Data similar to FIGS. 5 and 6 on an MOS structure with a 563 Å thermal oxide from a single crystal-degenerate silicon substrate showed less hysterisis for either voltage polarity than that observed for a negative gate polarity on the structure Sample A, as may be seen in FIG. 6. The amount of hysterisis for either polarity is greatest for the structure of Sample C, next is the structure of Sample B, and the smallest is for the structure of Sample A. The hysterisis for positive gate bias on the structure of Sample A, as shown in FIG. 5, has been reported by D. J. DiMaria and D. R. Kerr in the above-referenced article and elsewhere and is thought to be due to enhanced local trapping in the thermal oxide layer near the high field points due to the large local current densities. In subsequent voltage ramp cycles, all structures showed a memory effect in which negative-charge trapping in the previous cycle pushed the I-V characteristic out to higher average fields at the start of the next cycle. The rapid current increase for positive gate bias on the structure of Sample C is indicative of the beginning of current runaway near destructive breakdown.

If the differences between the I-V data of the structures of Samples B and C, as shown in FIGS. 5 and 6, are due to uniform negative-charge trapping in the W layer, one should, in principle, be able to determine the position of this layer from the voltage shifts between Samples B and C using a technique recently described by D. J. DiMaria in an article entitled "Determination of Insulator Bulk Trapped Charged Densities and Centroids From Photocurrent-Voltage Characteristics of MOS Structures", *Journal of Applied Physics*, Volume 47, No. 9, Sept. 1976, pages 4073–4077. This photo I-V relationship is:

$$\bar{x}/L = [1+(|\Delta V_g^-|/L)/(|\Delta V_g^+|/L)]^{-1}$$

where $\bar{x}$ is the centroid measured from the Al-CVD SiO$_2$ interface, L is the total oxide thickness of the structure, and $|\Delta V_g^+|$ and $|\Delta V_g^-|$ are the gate voltages shift magnitudes at a photo current constant current level for positive and negative gate bias, respectively. Using this equation and the experimental values of $|\Delta V_g^+|/L$ and $|\Delta V_g^-|/L$ from the data of FIGS. 5 and 6, the W layer was located at a distance of 72 Å from the poly Si-thermal SiO$_2$ interface which is in excellent agreement with the measured value of 70 Å. Only the data for current levels less than $3 \times 10^{-8}$ A/cm$^2$ were used in order to avoid the current runaway region on the structure of Sample C for positive gate bias.

Figure 7:
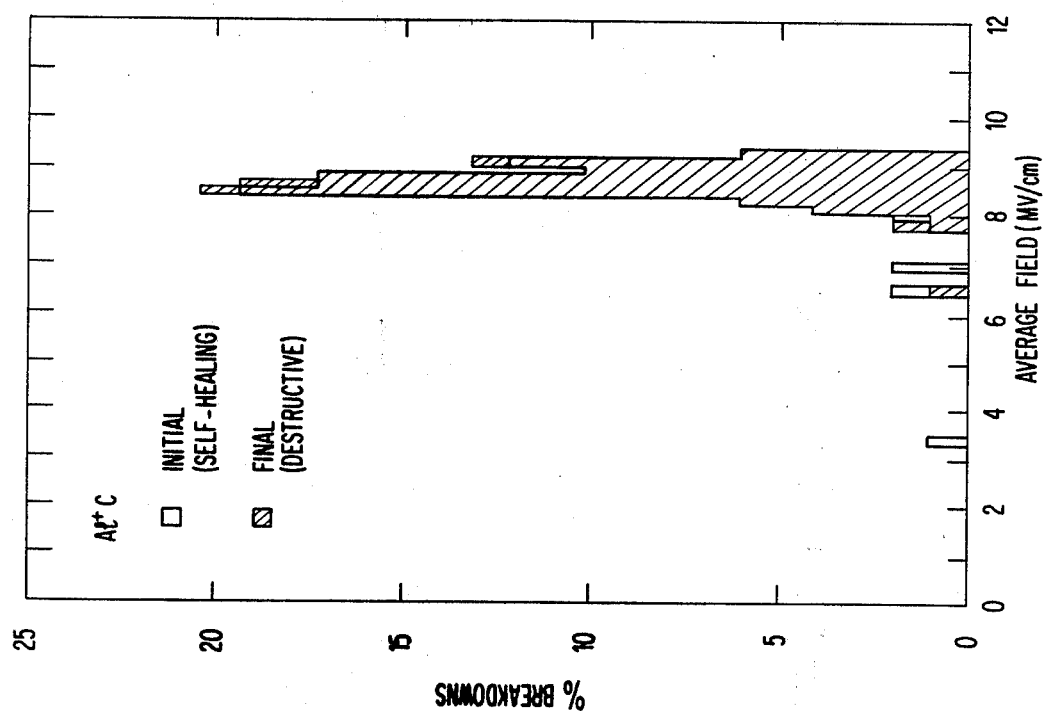
FIG. 7 is a histogram of Sample A of the percentage of dielectric breakdown events as a function of the magnitude of the average field under positive gate bias.
Figure 8:
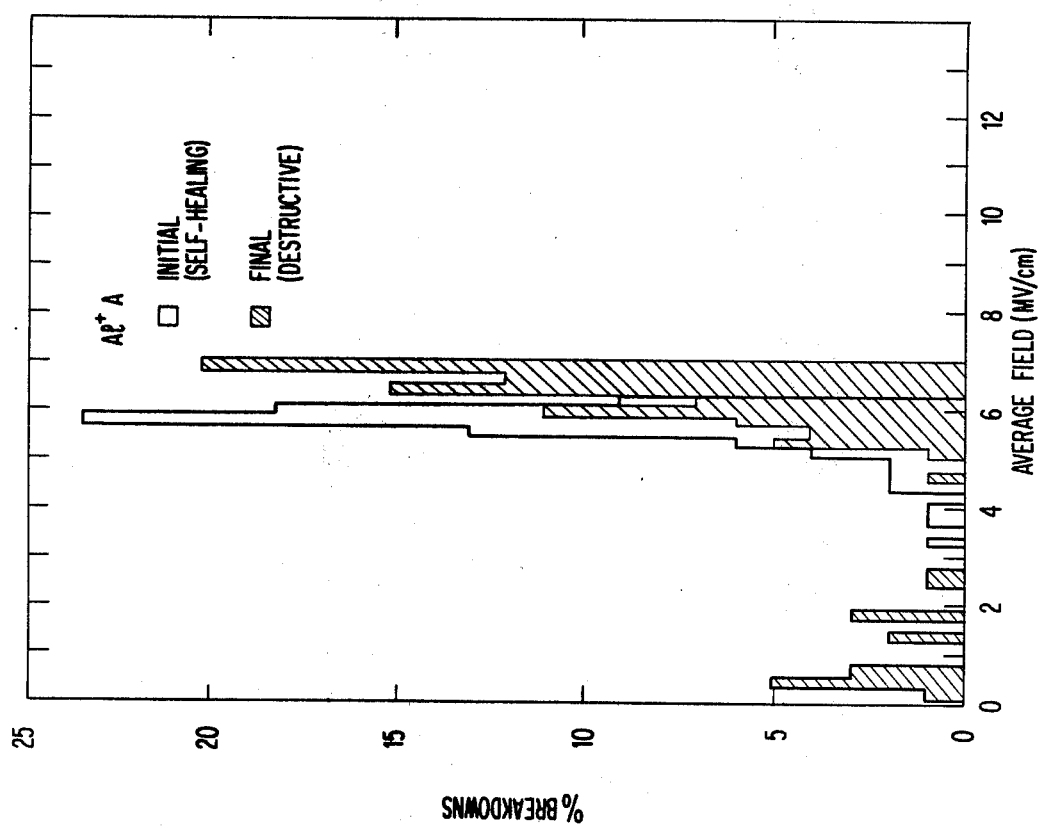
FIG. 8 is a histogram of Sample C of the percentage of dielectric breakdown events as a function of the magnitude of the average field under positive gate bias.

FIG. 7 and 8 show the self-healing and the destructive breakdown distributions for positive gate bias (poly-Si injecting) on the structures of Sample A and C. Both distributions for Sample C in FIG. 8 show very few low average field breakdowns which are characteristic of thermally-oxidized polycrystalline silicon surfaces, as shown for Sample A in FIG. 7. These histograms in FIG. 8 are in fact very tightly distributed around an average field of 8.8 MV/cm for such large area capacitors when compared to thermally-oxidized single crystal Si MOS structures.

The position of the W trapping layer was picked close to the polycrystalline Si-Thermal SiO$_2$ interface to maximize the field reduction between the negative trapped charge and this interface while simultaneously minimizing the possibility of discharge by field-assisted thermal emission or field emission to the CVD oxide conduction band in the field-enhanced region in the CVD oxide layer. However, the W region was chosen far enough away from the polycrystalline Si-thermal SiO$_2$ interface to prevent back tunneling to the poly Si. Generally, the W region should be greater than about 40-50 Å. On the other hand, the W region should not be so far away from the polycrystalline Si-thermal SiO$_2$ interface that the trapped charges have a lessened effect on the fields due to the asperities in the silicon surface. Based on practical considerations, the maximum distance of the W region away from the polycrystalline Si-thermal SiO$_2$ interface should not be greater than about 150 Å, and preferably on the order of less than 100 Å.

Figure 4:
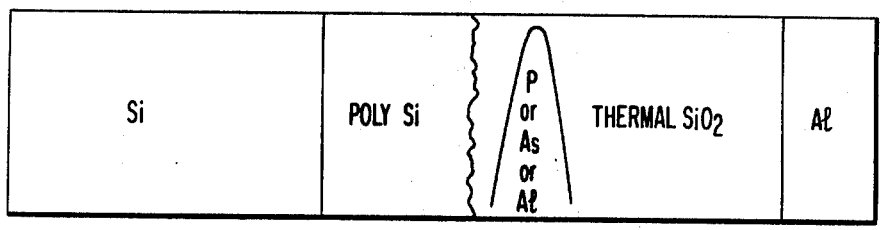
FIG. 4 is a cross-sectional view of a MOS structure according to a third embodiment of the invention.

While the use of a metal for the trapping layer, such as tungsten, in the structure of Sample C is quite effective, the structure of Sample B demonstrates that other trapping layers can be used to achieve the current reductions and increases in breakdown voltages according to the invention. These trapping layers could be formed by ion implantation, evaporation, or chemical vapor deposition. For example, the structure shown in FIG. 4 is essentially the same as the structure shown in FIG. 1, except that ions have been implanted in the thermal SiO$_2$ layer in a region corresponding to the W region in FIG. 3. The ions implanted may be phosphorus, arsenic or aluminum. Arsenic has been found to be particularly effective for forming electron traps in the thermal SiO$_2$ layer. The technique of using a trapping layer to increase breakdown voltages could be used in other capacitor structures besides MOS structures. For example, it is known to fabricate thin film capacitors from a tantalum or aluminum substrate by chemically growing an oxide of the substrate as the capacitor insulator. In the case of a tantalum substrate, the insulator would be Ta$_2$O$_5$; whereas in the case of an aluminum substrate, the insulator would be Al$_2$O$_3$. The substrate and insulator oxide interface has asperities which tend to limit the breakdown field of these thin film capacitors. In this type of structure, an electron trapping region can be formed closely adjacent to the substrate and oxide insulator interface by ion implantation.

We claim:

1. A high field capacitor structure comprising:
   a pair of spaced-apart electrodes; and
   an insulating layer dispersed between said pair of electrodes, said insulating layer having a carrier trapping region therein, wherein one of said electrodes is a substrate and the insulating layer is an oxide of the substrate, the interface between the substrate and the oxide having asperities which tend to produce localized high fields, said carrier trapping region being closely adjacent said interface and readily charged to reduce the large localized fields due to the asperities.

2. A high field capacitor structure as recited in claim 1 wherein said structure is an MOS structure comprising a base substrate material of single crystal silicon having deposited thereon a layer of polycrystalline silicon, the layer of polycrystalline silicon being partially thermally oxidized to form a relatively thin thermal oxide layer, a relatively thick layer of CVD SiO$_2$ deposited over the thin thermal oxide layer, and a metallic electrode deposited over the CVD SiO$_2$ layer.

3. A high field capacitor structure as recited in claim 2 wherein the thickness of the thin thermal oxide layer is sufficiently large to substantially eliminate the possibility of reverse tunneling from discharging the traps in the absence of an applied voltage.

4. A high field capacitor structure as recited in claim 2 wherein the thickness of the relatively thin thermal oxide layer is greater than 40 Å.

5. A high field capacitor structure as recited in claim 4 further including a very thin metallic layer between the relatively thin layer of thermal oxide and the CVD SiO$_2$ layer.

6. A high field capacitor structure as recited in claim 5 wherein said metallic layer is tungsten of about 10$^{14}$ atoms/cm$^2$.

7. A high field capacitor structure as recited in claim 5 wherein the thickness of the thin thermal oxide layer is sufficiently large to substantially eliminate the possibility of reverse tunneling from discharging the traps in the absence of an applied voltage.

8. A high field capacitor structure as recited in claim 5 wherein the thickness of the relatively thin thermal oxide layer is greater than 40 Å.

9. A high field capacitor structure as recited in claim 1 wherein said carrier trapping region is formed in said oxide by ion implantation.

10. A high field capacitor structure as recited in claim 9 having a MOS structure comprising a base substrate of single crystal silicon on which is deposited a layer of polycrystalline silicon, the layer of polycrystalline silicon being partially thermally oxidized to form the oxide insulator of the capacitor structure, and a metallic electrode deposited over the oxide insulator, the carrier trapping region being formed by ion implantation in a region closely adjacent to said interface.

11. A high field capacitor structure as recited in claim 16 wherein the ions implanted in the carrier trapping region are selected from the group consisting of phosphorus, arsenic and aluminum.

12. A high field capacitor structure as recited in claim 11 wherein the ions implanted in the carrier trapping region are arsenic.

13. A high field capacitor structure as recited in claim 9 wherein said capacitor structure is a thin film capacitor formed by chemically growing an oxide on a metallic substrate.

14. A high field capacitor structure as recited in claim 13 wherein said metallic substrate is selected from the group consisting of tantalum and aluminum, and the oxide grown on the substrate is selected from the group consisting of $Ta_2O_5$ and $Al_2O_3$, respectively, said carrier trapping region being formed by ion implantation in said oxide.

* * * * *

UNITED STATES PATENT AND TRADEMARK OFFICE
CERTIFICATE OF CORRECTION

PATENT NO. : 4,143,393
DATED : March 6, 1979
INVENTOR(S) : Donelli J. DiMaria and Donald R. Young It is certified that error appears in the above-identified patent and that said Letters Patent are hereby corrected as shown below:

Column 5, line 23, delete "$(|\Delta V_g^+|/L)$" and insert $--(|\Delta V_g^+|/L)--$; and lines 29-30, delete "$|\Delta V-_g^+|/L$ and $|\Delta V_g^-|/L$" and insert $--|\Delta V_g^+|/L$ and $|\Delta V_g^-|/L--$.

Column 8, line 2, before "wherein", delete "16" and insert --10--.

Signed and Sealed this

Seventeenth Day of July 1979

[SEAL]

Attest:

LUTRELLE F. PARKER

Attesting Officer

Acting Commissioner of Patents and Trademarks